United States Patent [19]

Zielinski

[11] Patent Number: 5,569,878
[45] Date of Patent: Oct. 29, 1996

[54] DOOR ASSEMBLY FOR SHIELDED ROOM

[76] Inventor: Stanley J. Zielinski, 348 E. Rolland Dr., Glendale Heights, Ill. 60139

[21] Appl. No.: 346,082

[22] Filed: Nov. 29, 1994

[51] Int. Cl.⁶ ............................................. H05K 9/00
[52] U.S. Cl. ........................... 174/35 R; 174/35 MS; 49/303
[58] Field of Search ..................... 174/35 R, 35 C, 174/35 MS; 361/816, 818; 277/901, 34, 34.3, 34.6; 49/303, 306, 307, 308

[56] References Cited

U.S. PATENT DOCUMENTS

| | | | |
|---|---|---|---|
| 4,786,758 | 11/1988 | Zielinski | 174/35 GC |
| 4,953,324 | 9/1990 | Herrmann | 49/255 |
| 5,013,869 | 5/1991 | Breithaupt | 174/35 MS |
| 5,017,736 | 5/1991 | Yarger et al. | 174/35 MS |
| 5,120,087 | 6/1992 | Pastva | 292/22 |
| 5,335,464 | 8/1994 | Vanesky et al. | 52/173.1 |
| 5,454,192 | 3/1995 | Adler et al. | 49/307 |
| 5,467,559 | 11/1995 | Owens | 49/321 |

OTHER PUBLICATIONS

"EMI RFI Shielding Doors", Jun. 7, 1993, DMCA Incorporated, Oceanside, CA 92054.
"EMI Shielding Doors", Tecknit Architectural Shielding Products, Cranford, NJ 07016.

*Primary Examiner*—Bot L. Ledynh
*Attorney, Agent, or Firm*—Cherskov & Flaynik

[57] ABSTRACT

A door assembly for an EMI shielded room includes door structure defining an inner space parallel to the door faces. Plates are mounted in the space for movement toward and away from the door edges. Support and guide assemblies precisely regulate the plate movement. A pneumatic bladder spaced inward from the door edges forces the plates to move outward and return springs retract the plates when the bladder is vented. The outer borders of the plates carry bumpers that force flexible contact members into engagement with the jamb and threshold of a doorway.

5 Claims, 2 Drawing Sheets

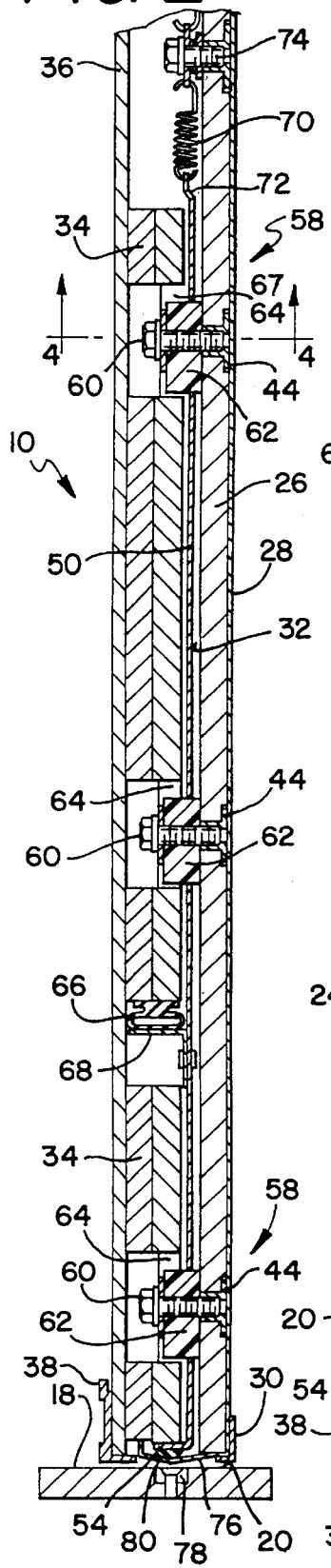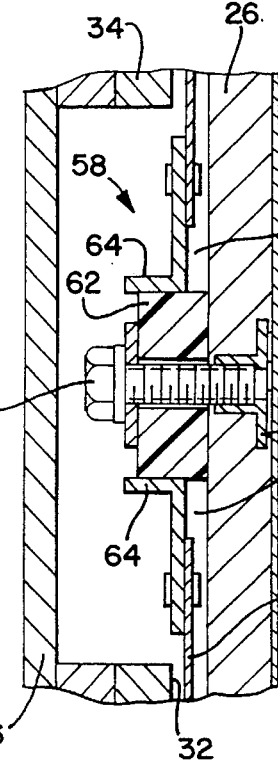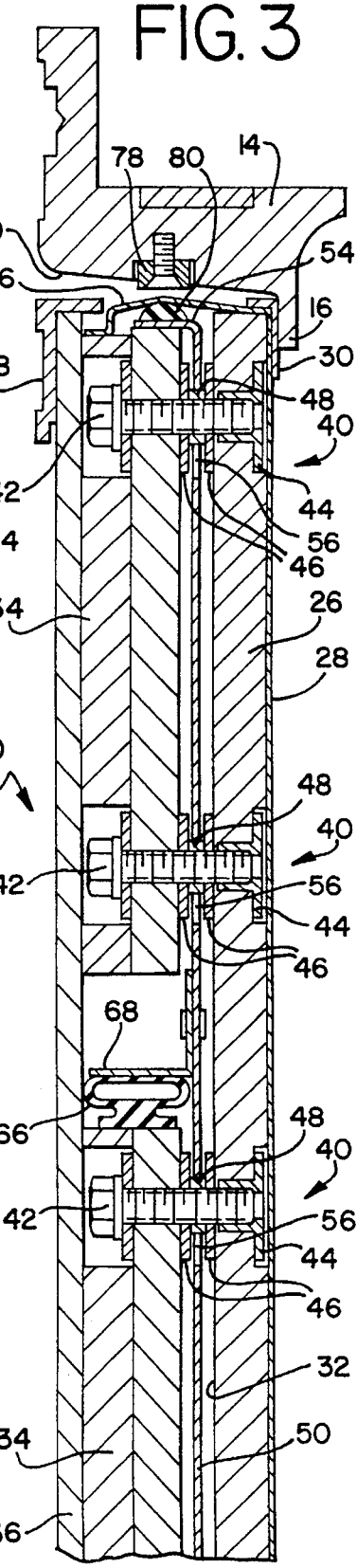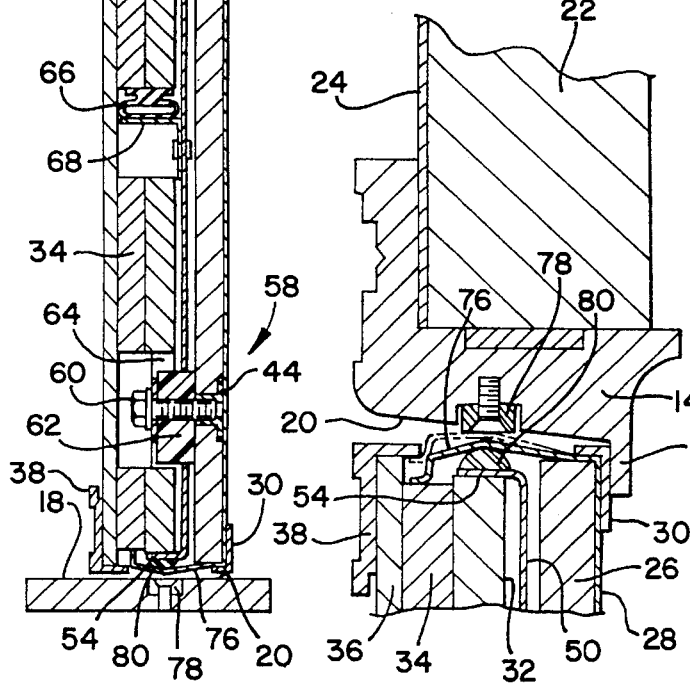

DOOR ASSEMBLY FOR SHIELDED ROOM

FIELD OF THE INVENTION

The present invention relates to electromagnetic interference (EMI) shielding and more particularly to a door assembly for a shielded room.

DESCRIPTION OF THE PRIOR ART

Shielded rooms are used to attenuate interference from electromagnetic radiation such as radio frequency (RF) radiation. The walls, floor and ceiling of a shielded room are typically provided with single or multiple shields of electrically conductive metal sheet, mesh or screen. Such rooms are used for many types of shielding applications where radiation must be contained within a room or prevented from entering a room. One example is a room containing magnetic resonance imaging apparatus.

A door is typically provided so that personnel may enter and leave the room. In order to maintain the integrity of the shielding, the door itself includes a shield in the form of one or more layers of metal sheet, mesh or screen. When the door is in its closed position, the gap between the door and the jam must be shielded and the shield of the door must be continuously and intimately connected to the shield of the room throughout the gap at the sides, top and bottom of the door. Although door assemblies for EMI shielded rooms have included various types of door gap shielding systems, each known type has disadvantages.

One approach has been to use flexible contact fingers along the edges of the door. The fingers are connected to the door shield. When the door is closed, the fingers resiliently engage a contact area on the door jamb. U.S. Pat. No. 4,786,758 discloses a particularly effective example of this type of system. Although the shield disclosed in that patent has been successful, it is subject to a disadvantage that when the door is moved into or out of the closed position, force is necessary to overcome friction between the resilient fingers and the jamb. Systems using fingers are also subject to damage and the need for repair if the fingers are broken or deformed.

Another approach has been to use a pneumatic bladder running around the door edge to force a conductive braid out against the jam with air pressure when the door is closed. With this system, the conductive braid does not engage the jamb until after the door has been closed and there is no frictional force to be overcome. However the system has other disadvantages. For one thing systems of this type require doors and jambs with rounded rather than square corners because the bladder cannot operate around sharp corners. In addition, the braid can become rough or abrasive after a period of use. Another major disadvantage is that the braided or otherwise electrically conductive material covered bladder results in two seals rather than one. Each of these two seals represent a potential point of RF leakage. Also, because the braid or other electrically conductive material must be flexible, such seals are not capable of providing the same level of shielding effectiveness as solid metallic contact fingers. Further, such seals are not easy to clean.

SUMMARY OF THE INVENTION

A principal object of the present invention is to provide an improved door assembly for shielded rooms having a door gap shielding system that avoids frictional forces when the door is moved to or from the closed position yet permits square corners and presents a rugged, smooth and long lasting door edge. Another object is to provide a door assembly that overcomes the disadvantages of shielded room door assemblies used in the past.

In brief, in accordance with the invention there is provided a door assembly for an EMI shielded room having an electrically conductive room shield and a doorway bounded by a jamb including an electrically conductive contact area connected to the room shield. The door assembly includes a door structure including a support frame defining a door edge and opposed door face panels supported by the frame. The door structure is mounted for movement relative to the jamb to a closed position. A gap is defined between the jamb and the door edge in the closed position. An electrically conductive door shield is supported by the door structure and extends parallel with the face panels. A thin, flexible sheet metal contact is electrically connected to the door shield and is mounted on the door structure adjacent the door edge for flexing movement in the gap toward and away from the contact area of the jamb. A pusher assembly supported by the frame includes a relatively rigid base mounted adjacent the door edge for movement toward and away from the gap with a bumper between the base and the contact. The base is moved toward the gap in order to press the bumper against the contact and force the contact into engagement with the contact area of the mating jamb.

BRIEF DESCRIPTION OF THE DRAWING

The present invention together with the above and other objects and advantages may best be understood from the following detailed description of the preferred embodiments of the invention illustrated in the drawings, wherein:

FIG. 2 is an enlarged fragmentary sectional view taken along the line 2—2 of FIG. 1;

FIG. 3 is an enlarged fragmentary sectional view taken along the line 3—3 of FIG. 1;

FIG. 4 is an enlarged fragmentary sectional view taken along the line 4—4 of FIG. 2; and FIG. 5 is a fragmentary sectional view showing engagement of the door assembly with a jamb in a wall of a shielded room.

DETAILED DESCRIPTION OF THE PREFERRED EMBODIMENTS

Figure 1:
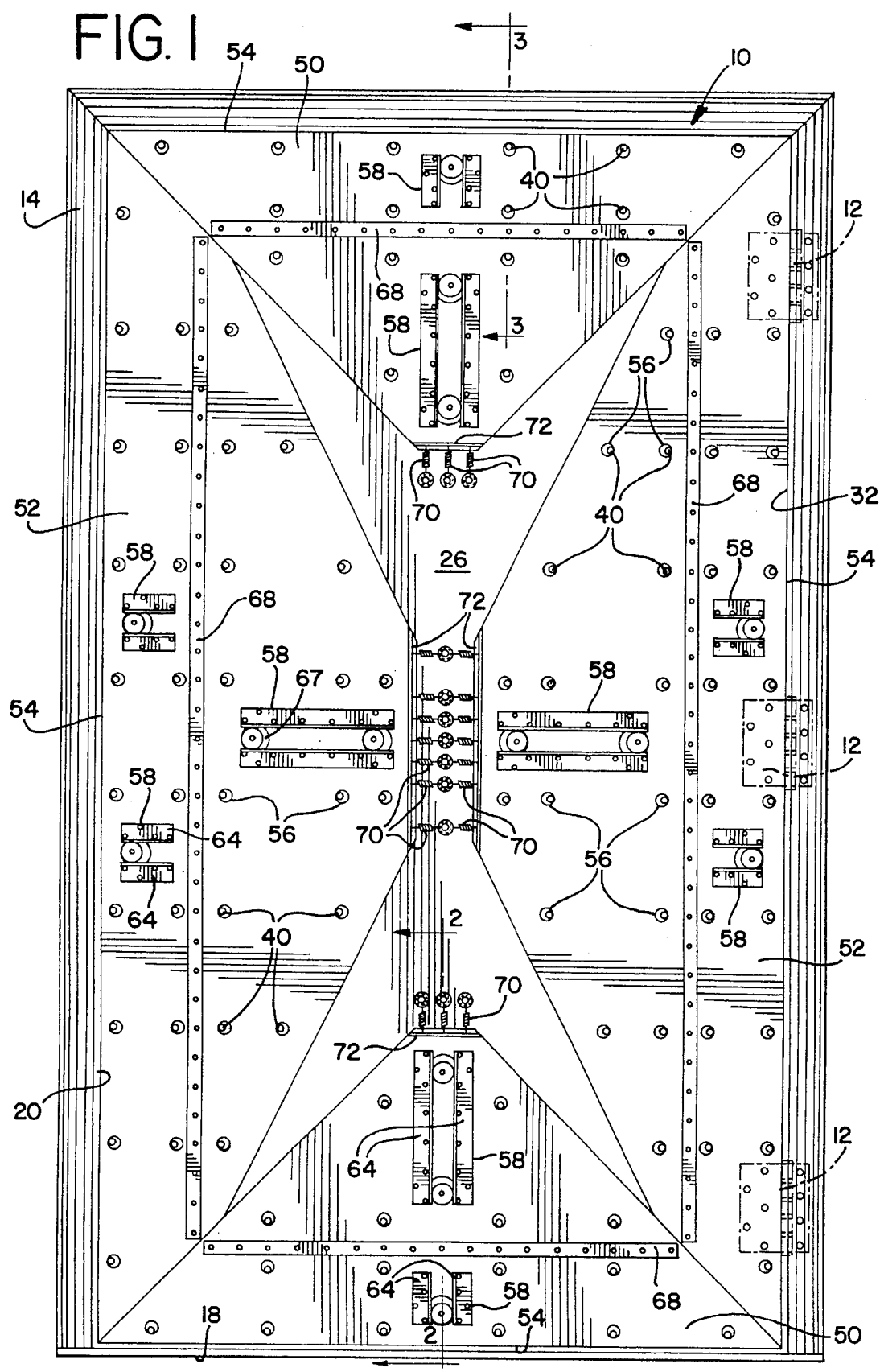
FIG. 1 is an elevational view of a door assembly embodying the present invention with components of the assembly including pressure blocks, bladder and cover panel removed to reveal other components of the assembly.

Having reference now to the drawings, there is illustrated a door assembly generally designated as 10 and constructed in accordance with the principles of the present invention. The door assembly 10 is supported by hinges 12 and may be closed into a door jamb 14 including a door stop 16 at the sides and top and a threshold 18 at the bottom. In the closed position there is a gap 20 at the sides, top and bottom of the door. The jamb 14 is electrically conductive and is mounted in a wall 22 of a shielded room. Wall 22 includes a conductive shield 24 in electrical contact with the jamb 14. Similarly a shield in the floor (not shown) is in contact with the threshold 18.

The door assembly has a structural frame including a support panel 26 entirely covering one face of the door assembly. A conductive shield 28 overlies the outer surface of the support panel 26. A conductive metal edge trim member 30 overlies the border of the shield 28 along all four edges of the door assembly 10.

A thin, flat, planar space 32 is defined within the door assembly at the inner surface of the support panel 26. The opposite side of the space 32 is defined by the surfaces of a plurality of pressure blocks 34. The face of the door assembly 10 opposite the support panel is provided with a cover panel 36 extending to the four edges of the door assembly 10. The borders of the cover panel 36 are received within a trim member 38.

The support panel 26 and the pressure blocks 34 are attached together at opposite sides of the planar space 32 by numerous support assemblies 40. Each support assembly 40, as best seen in FIG. 3, includes a bolt 42 extending through one of the pressure blocks 34 and threaded into a tee nut 44 received in the support panel 26. The space 32 is provided by a pair of flat washers 46 and a spacer 48 held in compression between the support panel 26 and the pressure block 34.

Within the space 32 are mounted a pair of similar upper and lower plates 50 and a pair of similar side plates 52. The plates 50 and 52 are of a relatively stiff material such as sheet metal or the like. Each plate 50 and 52 extends to one of the four linear door edges and has a linear outer edge or border 54 that generally coincides with the corresponding door edge. The borders 54 extend into the four sharp corners of the door assembly 10. The plates are provided with circular openings 56. There is a circular opening 56 for each of the support assemblies 40. Each opening 56 has a diameter larger than the diameter of the spacers 48, and the thickness of the plates 50 and 52 is smaller than the total length of the spacers 48.

Each plate is captured between the pairs of washers 46 with limited freedom to move within the space 32 in the direction parallel to the plate and parallel to the door faces. The amount of movement is determined by the clearance provided by the openings 56 around the spacers 48. For example in a preferred embodiment of the invention, a three eighths inch movement is permitted by using a spacer having a half inch diameter within a seven eighths inch opening. The use of numerous openings 56 and support assemblies holds the plates 50 and 52 flat and prevents them from buckling.

The direction of movement of the plates 50 and 52 is controlled by guide assemblies 58 best seen in FIGS. 2 and 4. Each guide assembly 58 includes a bolt 60 extending through a bearing 62 and threaded into a tee nut 44. The bearing 62 is slidably received between a pair of guide flanges provided by angles 64 attached to the plate 50 or 52 near opposite sides of clearance holes 67. Each plate 50 and 52 is constrained to move only in the direction parallel to the angles 64 attached to that plate. Plates 50 move vertically and perpendicular to the top and bottom door edges. Plates 52 move horizontally, perpendicular to the side door edges. Bearings 62 are circular and eccentric so that they may be rotated to precisely adjust the positions of the plates 50 and 52.

The plates 50 and 52 are moved outward, toward the corresponding door edge by pressurizing a pneumatic bladder 66 that extends along a path delineated by force transfer brackets 68 attached to the plates 50 and 52 in a rectangular pattern. Each bracket 68 is parallel to and spaced inwardly from the border 54 of the respective plate 50 or 52. As seen in FIG. 3, the bladder is affixed to the side edge of a pressure block 34 and engages the bracket 68. When pressurized air is admitted to the bladder 66, force is applied to the brackets 68 to move the plates 50 and 52 outward.

When air pressure is exhausted from bladder 66, the plates 50 and 52 are retracted inward by return springs 70. Springs 70 are attached in tension between inner edges 72 of the plates 50 and 52 and support bolts 74 attached to the support panel.

The full extent of each of the edges of the door assembly 10 is provided with one or more electrically conductive contacts 76. For example, each contact 76 may be several inches in length, providing a sturdy and attractive door edge. Preferably the contacts 76 are a web of flexible sheet metal material such as copper. One edge of each contact is fixed to the door assembly 10 and electrically connected to the shield 28 by the trim member 30. The opposite edge of each contact 76 has limited freedom to move outwardly away from the door edge and into contact with a jamb contact area provided by an optional insert 78 in the jamb 14 or threshold 18. Cooperating lips are provided at the free end of the contact 76 and by the trim member 38 in order to capture and protect the contact 76.

The outer borders 54 of the plates 50 and 52 are in the form of right angle flanges. Each flange 54 carries a soft, resilient bumper 80 formed of a foam rubber like material. Bumpers 80 transfer force from the flanges 54 of the plates 50 and 52 to the undersides of the contacts 76 and permit the contacts 76 to comply with various conditions such as variance in the width of the gap 20.

Normally the bladder 66 is not pressurized and the springs 70 hold the plates 50 and 52 in their retracted positions. The contacts 76 are normally in their retracted positions shown in full lines in FIG. 5. When the door assembly 10 is moved between the open position and the closed position seen in FIGS. 1–3 and 5, the contacts 76 do not engage the jamb 14 or threshold 16. As a result it is not necessary to overcome frictional forces and the door is relatively easy to operate.

After the door is moved to the closed position, the bladder 66 is pressurized. Force transmitted from the expanded bladder 66 to the plates 50 and 52 by the brackets 68 act in opposition to the springs 70. The plates move in a direction precisely controlled by the assemblies 58 and for a distance precisely controlled by the assemblies 40. This movement causes the border flanges 54 to press the bumpers 80 against the undersides of the contacts 76. The contacts 76 are forced outward into intimate contact with the jamb and threshold contact areas provided by the inserts 78. This engaged position is shown in broken lines in FIG. 5.

Before the door is reopened, the bladder 66 is vented. The springs 70 retract the plates 50 and 52, and the resilience of the contact members causes them to return to the retracted position seen in full lines in FIG. 5.

While the present invention has been described with reference to the details of the embodiments of the invention shown in the drawing, these details are not intended to limit the scope of the invention as claimed in the appended claims. It should be understood that hydraulic and electromechanical arrangements could be used in accordance with principles of the present invention.

What is claimed is:

1. A door assembly for an EMI shielded room having an electrically conductive room shield and a doorway bounded by a jamb including an electrically conductive contact area connected to the room shield, said door assembly comprising:

a door structure including a support frame defining a door edge and opposed door face panels supported by said frame;

means mounting said door structure for movement relative to the jamb to the closed position;

a gap defined between the jamb and said door edge in said closed position;

an electrically conductive door shield supported by said door structure and extending parallel with said face panels; and a thin, flexible sheet metal contact electrically connected to said door shield and mounted on said door structure adjacent said door edge for flexing movement in said gap toward and away from the contact area of the jamb, said contact comprising an elongated web extending along said gap;

said door assembly being characterized by:

a pusher assembly supported by said frame;

said pusher assembly including a relatively rigid base mounted adjacent said door edge for movement toward and away from said gap and a foam rubber like bumper between said base and said contact; and means for moving said base toward said gap in order to press said bumper against said contact and force said contact into engagement with said contact area of the jamb.

2. A door assembly as claimed in claim 1, one edge of said web being fixed to said door structure and the opposite edge of said web being movable relative to said door structure.

3. A door assembly as claimed in claim 2, said door structure further including an anti-overtravel lip adjacent said gap engageable with said movable edge of said contact.

4. A door for an EMI shielded room, said door comprising:

a rectangular framework having square corners, opposed faces and having top, bottom and opposed side edges;

a metal shield extending between said edges;

electrical contact means carried by said framework and extending around the door periphery at said edges, said electrical contact means been electrically connected to said shield;

a flat, planar internal space defined by said framework, said space being parallel with said faces and extending to said edges;

said framework including a plurality of supports extending across said space in a direction perpendicular to said faces;

a plurality of flat, planar plates, each having an outer, linear border disposed adjacent one of said edges;

said plates having apertures receiving said supports with clearance permitting movement of said plates toward and away from said edges;

first and second force application means for moving said plates respectively outward toward said edges or inward away from said edges;

contact actuating means carried by said borders of said plates for moving said contacts outward in a direction parallel to said faces in response to outward movement of said plates; and guide means on at least some of supports for controlling the movement of said plates.

5. The door of claim 4, said guide means including bearing means for limiting movement of each plate to a direction perpendicular to its border.

* * * * *